(12) United States Patent
Jagtap et al.

(10) Patent No.: US 9,613,778 B1
(45) Date of Patent: Apr. 4, 2017

(54) CONNECTOR FOR PROCESS CHAMBER ELECTROSTATIC ELEMENTS

(71) Applicant: Varian Semiconductor Equipment Associates, Inc., Gloucester, MA (US)

(72) Inventors: Mayur Jagtap, Burlington, MA (US); Eric Hermanson, Georgetown, MA (US); James Alan Pixley, Dover, NH (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 0 days.

(21) Appl. No.: 15/147,979

(22) Filed: May 6, 2016

(51) Int. Cl.
*H01J 37/12* (2006.01)

(52) U.S. Cl.
CPC .................................. *H01J 37/12* (2013.01)

(58) Field of Classification Search
CPC ........ H01J 37/12; H01J 37/14; H01J 37/1413; H01J 37/1416; H01J 37/26; H01J 37/28; H01J 37/3171; H01J 37/3174
See application file for complete search history.

(56) References Cited

U.S. PATENT DOCUMENTS

| | | | |
|---|---|---|---|
| 2012/0001087 A1* | 1/2012 | Radovanov | H01J 37/12 250/396 R |
| 2015/0028202 A1* | 1/2015 | Chiappetta | H01J 49/405 250/287 |

* cited by examiner

*Primary Examiner* — David E Smith

(57) ABSTRACT

Provided herein are approaches for securing electrostatic elements within a lens component. In one approach, a connector includes a flexible coupling secured at a first end to an electrostatic element of a plurality of electrostatic elements, the plurality of electrostatic elements extending between a set of sidewalls of the lens component. The connector further includes a stub protruding from a feedthrough component provided through the set of sidewalls, the stub secured to the flexible coupling at a second end of the flexible coupling.

20 Claims, 7 Drawing Sheets

CONNECTOR FOR PROCESS CHAMBER ELECTROSTATIC ELEMENTS

FIELD OF THE DISCLOSURE

The disclosure relates generally to electrostatic elements, and more particularly, to connectors for securing electrostatic elements within a lens component of a process chamber.

BACKGROUND OF THE DISCLOSURE

Ion implantation is a process of introducing dopants or impurities into a substrate via bombardment. In semiconductor manufacturing, the dopants are introduced to alter electrical, optical, or mechanical properties. For example, dopants may be introduced into an intrinsic semiconductor substrate to alter the type and level of conductivity of the substrate. In manufacturing an integrated circuit (IC), a precise doping profile provides improved IC performance. To achieve a particular doping profile, one or more dopants may be implanted in the form of ions in various doses and various energy levels.

Ion implantation systems may comprise an ion source and a series of beam-line components. The ion source may comprise a chamber where ions are generated. The ion source may also comprise a power source and an extraction electrode assembly disposed near the chamber. The beam-line components, may include, for example, a mass analyzer, a first acceleration or deceleration stage, a collimator, and a second acceleration or deceleration stage. Much like a series of optical lenses for manipulating a light beam, the beam-line components can filter, focus, and manipulate ions or ion beam having particular species, shape, energy, and/or other qualities. The ion beam passes through the beam-line components and may be directed toward a substrate mounted on a platen or clamp. The substrate may be moved in one or more dimensions (e.g., translate, rotate, and tilt) by an apparatus, sometimes referred to as a roplat.

One particular beam-line component is a Vertical Electrostatic Energy Filter (VEEF) containing a set of electrostatic elements (e.g., graphite rods) used to control deflection, deceleration, and/or focus of the ion beam. The electrostatic elements of the VEEF are secured to a frame via a set of mechanical connectors. Prior approaches secure the electrostatic elements to the frame using a feedthrough mounting stub secured directly to the electrostatic elements. As a result, prior approach connectors are subject to breakage, as the electrostatic elements heat up during use. Furthermore, prior approach connectors suffer from arcing, as current may find unexpected paths, causing material to be released into the beam path and, ultimately, on the wafer. Still furthermore, the feedthrough mounting stub is not fully shielded from the ion beam, thus causing metal contamination to the beam in the event of a lateral beam strike.

SUMMARY

In view of the foregoing, provided herein are approaches for securing electrostatic elements within a lens component positioned in a high current tool, such as an ion implanter, directly upstream of a wafer. In one approach, a connector includes a flexible coupling secured at a first end to an electrostatic element of a plurality of electrostatic elements, the plurality of electrostatic elements extending between a set of sidewalls of the lens component. The connector further includes a stub protruding from a feedthrough component provided through the set of sidewalls, the stub secured to the flexible coupling at a second end of the flexible coupling.

In another approach according to the disclosure, a connector of an energy purity module (EPM) includes a flexible coupling secured at a first end to each of a plurality of electrostatic elements, wherein the plurality of electrostatic elements extending between a set of sidewalls of the EPM. The connector further includes a stub protruding from a feedthrough component provided through the set of sidewalls, the stub secured to the flexible coupling at a second end of the flexible coupling.

In yet another approach of the disclosure, a method includes providing an electrostatic element extending between a set of sidewalls of an energy purity module (EPM), and providing a feedthrough component through an opening in the set of sidewalls. The method further includes coupling the feedthrough component to electrostatic element using a connector, the connector including a flexible coupling secured at a first end to the electrostatic element and at a second end to a stub protruding from the feedthrough component.

Figure 1:
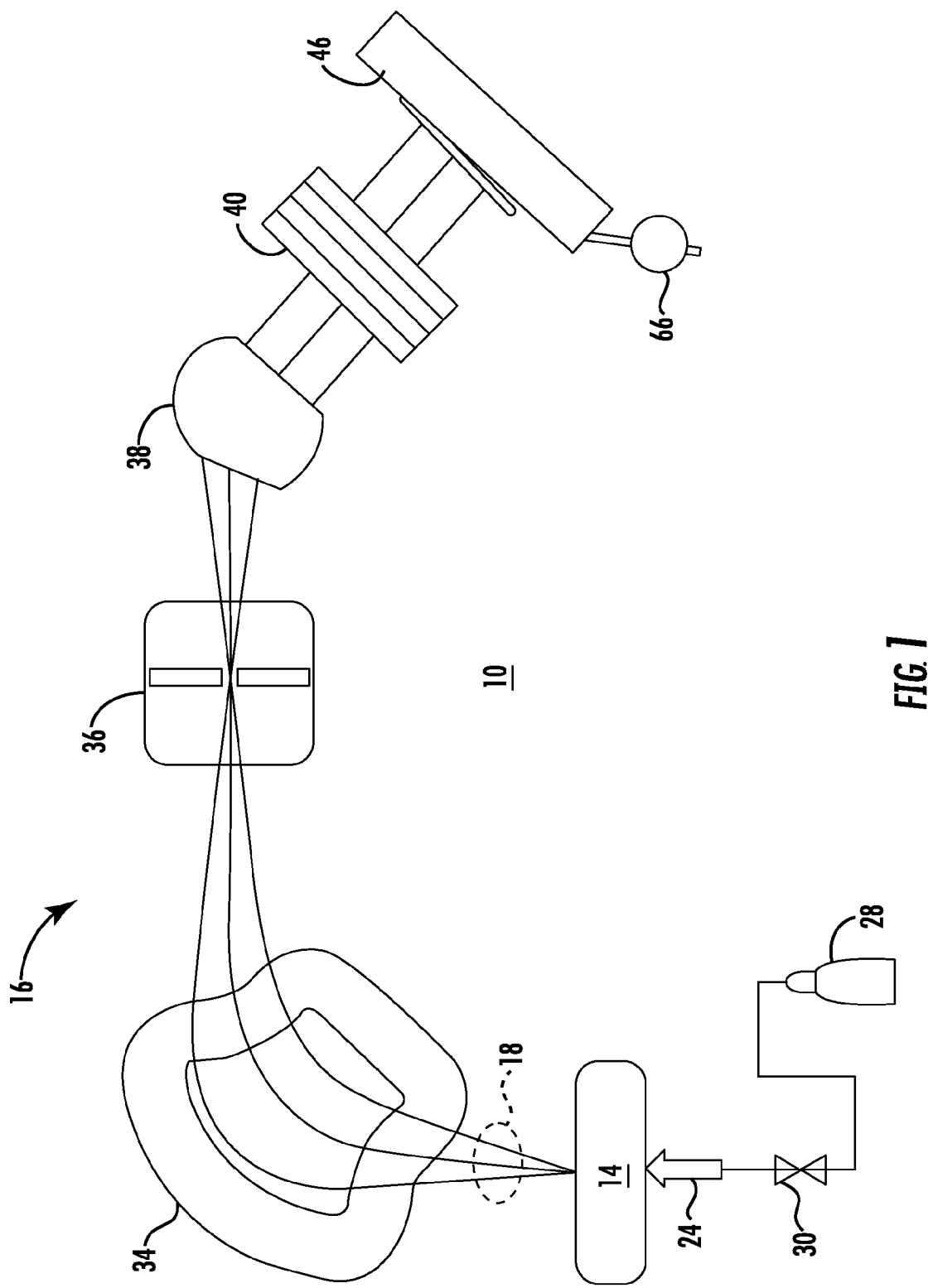
FIG. 1 is a schematic view illustrating an ion implantation system in accordance with embodiments of the present disclosure.

The drawings are not necessarily to scale. The drawings are merely representations, not intended to portray specific parameters of the disclosure. The drawings are intended to depict exemplary embodiments of the disclosure, and therefore are not be considered as limiting in scope. In the drawings, like numbering represents like elements.

Furthermore, certain elements in some of the figures may be omitted, or illustrated not-to-scale, for illustrative clarity. Furthermore, for clarity, some reference numbers may be omitted in certain drawings.

DETAILED DESCRIPTION

A system and method in accordance with the present disclosure will now be described more fully hereinafter with reference to the accompanying drawings, where embodiments of the system and method are shown. The system and method may be embodied in many different forms and are not be construed as being limited to the embodiments set forth herein. Instead, these embodiments are provided so this disclosure will be thorough and complete, and will fully convey the scope of the system and method to those skilled in the art.

For the sake of convenience and clarity, terms such as "top," "bottom," "upper," "lower," "vertical," "horizontal," "lateral," and "longitudinal" will be used herein to describe the relative placement and orientation of these components and their constituent parts, with respect to the geometry and orientation of a component of a semiconductor manufacturing device as appearing in the figures. The terminology will include the words specifically mentioned, derivatives thereof, and words of similar import.

As used herein, an element or operation recited in the singular and proceeded with the word "a" or "an" are understood as potentially including plural elements or operations as well. Furthermore, references to "one embodiment" of the present disclosure are not intended to be interpreted as precluding the existence of additional embodiments also incorporating the recited features.

As stated above, provided herein are approaches for securing electrostatic elements within a lens component positioned in a high current tool, such as an ion implanter, directly upstream of a wafer. In one approach, a connector includes a flexible coupling secured at a first end to each of a plurality of electrostatic elements, the plurality of electrostatic elements extending between a set of sidewalls of the lens component. The connector further includes a stub protruding from a feedthrough component provided through the set of sidewalls, the stub secured to the flexible coupling at a second end of the flexible coupling. In some embodiments, the flexible coupling and the stub overlap, and are secured together by a set of fasteners.

Referring now to FIG. 1, an exemplary system 10, such as an ion implantation system, in accordance with the present disclosure is shown. The ion implantation system (hereinafter "system") 10 represents a process chamber containing, among other components, an ion source 14 for producing an ion beam 18, an ion implanter, and a series of beam-line components. The ion source 14 may comprise a chamber for receiving a flow of gas 24 and generates ions. The ion source 14 may also comprise a power source and an extraction electrode assembly disposed near the chamber. The beam-line components 16 may include, for example, a mass analyzer 34, a first acceleration or deceleration stage 36, a collimator 38, and a lens component 40 (hereinafter referred to as an energy purity module (EPM)) corresponding to a second acceleration or deceleration stage.

In exemplary embodiments, the beam-line components 16 may filter, focus, and manipulate ions or the ion beam 18 to have a particular species, shape, energy, and/or other qualities. The ion beam 18 passing through the beam-line components 16 may be directed toward a substrate mounted on a platen or clamp within a process chamber 46. The substrate may be moved in one or more dimensions (e.g., translate, rotate, and tilt).

As shown, there may be one or more feed sources 28 operable with the chamber of the ion source 14. In some embodiments, material provided from the feed source 28 may include source material and/or additional material. The source material may contain dopant species introduced into the substrate in the form of ions. Meanwhile, the additional material may include diluent, introduced into the ion source chamber of the ion source 14 along with the source material to dilute the concentration of the source material in the chamber of the ion source 14. The additional material may also include a cleaning agent (e.g., an etchant gas) introduced into the chamber of the ion source 14 and transported within the system 10 to clean one or more of the beam-line components 16.

In various embodiments, different species may be used as the source and/or the additional material. Examples of the source and/or additional material may include atomic or molecular species containing boron (B), carbon (C), oxygen (O), germanium (Ge), phosphorus (P), arsenic (As), silicon (Si), helium (He), neon (Ne), argon (Ar), krypton (Kr), nitrogen (N), hydrogen (H), fluorine (F), and chlorine (Cl). Those of ordinary skill in the art will recognize the above listed species are non-limiting, and other atomic or molecular species may also be used. Depending on the application(s), the species may be used as the dopants or the additional material. In particular, one species used as the dopants in one application may be used as the additional material in another application, or vice-versa.

In exemplary embodiments, the source and/or additional material is provided into the ion source chamber of the ion source 14 in gaseous or vapor form. If the source and/or additional material is in non-gaseous or non-vapor form, a vaporizer (not shown) may be provided near the feed source 28 to convert the material into gaseous or vapor form. To control the amount and the rate the source and/or the additional material is provided into the system 10, a flowrate controller 30 may be provided.

Figure 2:
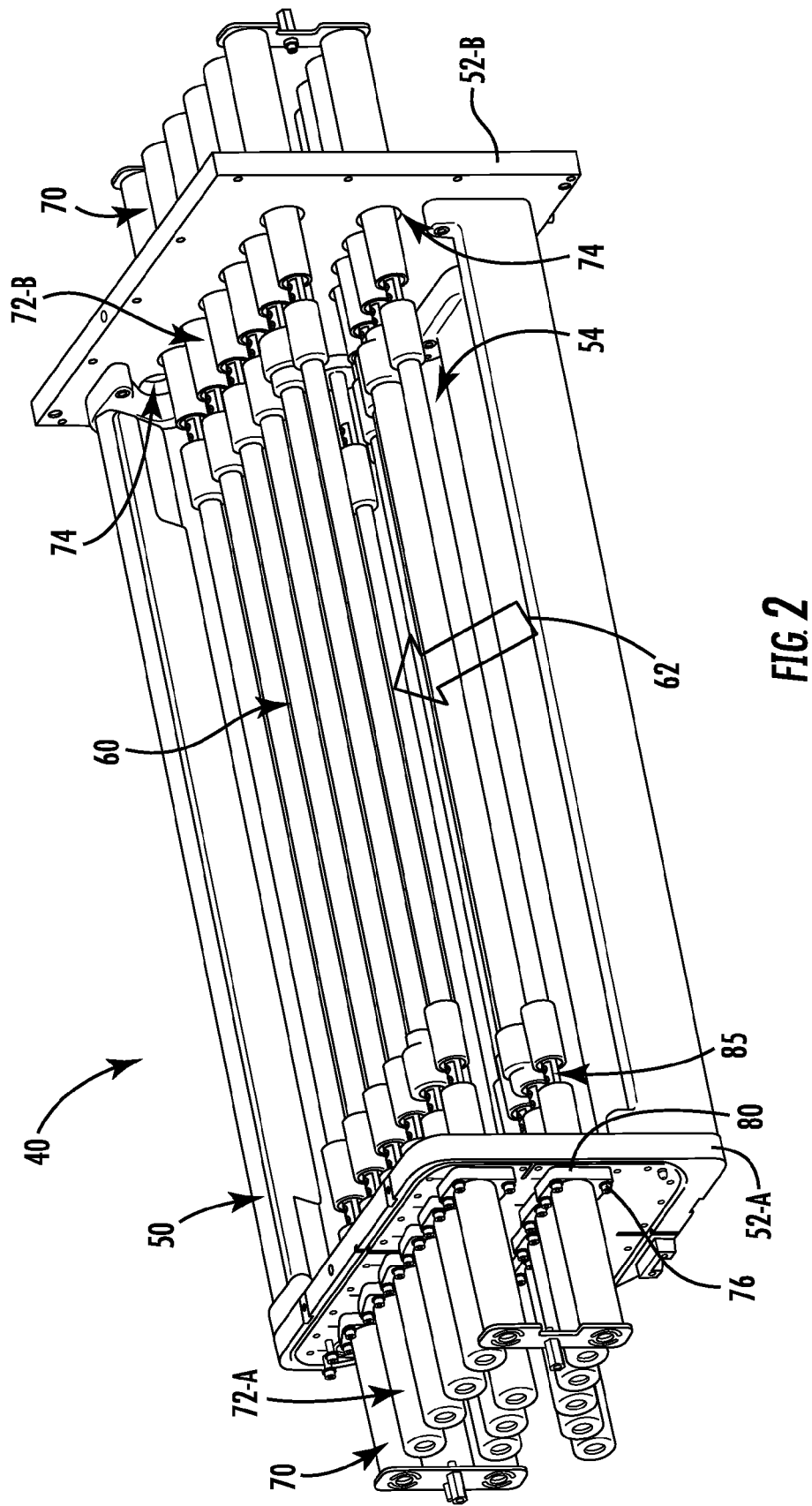
FIG. 2 is an isometric view illustrating a lens component of the ion implantation system shown in FIG. 1 in accordance with embodiments of the present disclosure.

Referring now to FIGS. 1-2, the EPM 40 will be described in greater detail. In some embodiments, the EPM 40 is a beam-line lens component configured to independently control deflection, deceleration, and focus of the ion beam 18. For example, the EPM 40 may be a vertical electrostatic energy filter (VEEF) or electrostatic filter (EF). As will be described in greater detail below, the EPM 40 may include an electrode configuration comprising a set of upper electrodes disposed above the ion beam 18 and a set of lower electrodes disposed below the ion beam 18. The set of upper electrodes and the set of lower electrodes may be stationary and have fixed positions. A difference in potentials between the set of upper electrodes and the set of lower electrodes may also be varied along the central ion beam trajectory to reflect an energy of the ion beam at various point along the central ion beam trajectory for independently controlling deflection, deceleration, and/or focus of an ion beam.

In one embodiment, the EPM 40 includes a frame 50 including a set of opposing sidewalls 52A-B defining an interior area 54 containing a plurality of conductive beam optics 60 (hereinafter referred to as electrostatic elements). In one embodiment, the electrostatic elements 60 are graphite rods extending between the set of sidewalls 52A-B, the electrostatic elements 60 disposed along (e.g., above and below) an ion beam-line/trajectory 62, as shown.

In some embodiments, the electrostatic elements 60 are arranged in a symmetrical configuration, including a set of entrance electrodes, a set of exit electrodes, and a plurality of suppression/focusing electrodes. The electrostatic elements 60 may include pairs of conductive pieces electrically coupled to one another, for example, on opposite sides of the ion beam-line/trajectory 62. Alternatively, the electrostatic elements 60 may be a series of unitary structures each including an aperture for the ion beam to pass therethrough. In the embodiment shown, upper and lower portions of each electrode pair may have different potentials (e.g., in separate conductive pieces) in order to deflect the ion beam passing therethrough. One will appreciate the electrostatic elements 60 may include a variety of shapes, curvatures, positions, materials, and/or configurations independently or separately controlled/biased with respect to one another, thus providing flexible and effective manipulation of an ion beam's shape as well as its energy.

In some embodiments, the ion beam passing through the electrodes along the ion beam-line/trajectory 62 may include boron or other elements. Electrostatic focusing of the ion beam may be achieved by using several thin electrodes (e.g., the suppression/focusing electrodes) to control grading of potential along the ion beam-line/trajectory 62. In the configuration of electrostatic elements 60 shown, high deceleration ratios may also be provided. As a result, use of input ion beams may be used in an energy range to enable higher quality beams, even for very low energy output beams. In one non-limiting example, as the ion beam passes through the electrodes of the electrostatic elements 60, the ion beam may be decelerated from 6 keV to 0.2 keV and deflected at 15°. In this non-limiting example, the energy ratio may be 30/1.

During use, the EPM 40 receives a voltage and a current from a power supply (not shown) to generate an electric field to accelerate ions along the ion beam-line 62. More specifically, the voltage/current may be supplied to the electrostatic elements 60, and may be constant or varied. In one embodiment, the electrostatic elements 60 are held at a series of DC potentials from 0.1 keV-100 keV.

Figure 3:
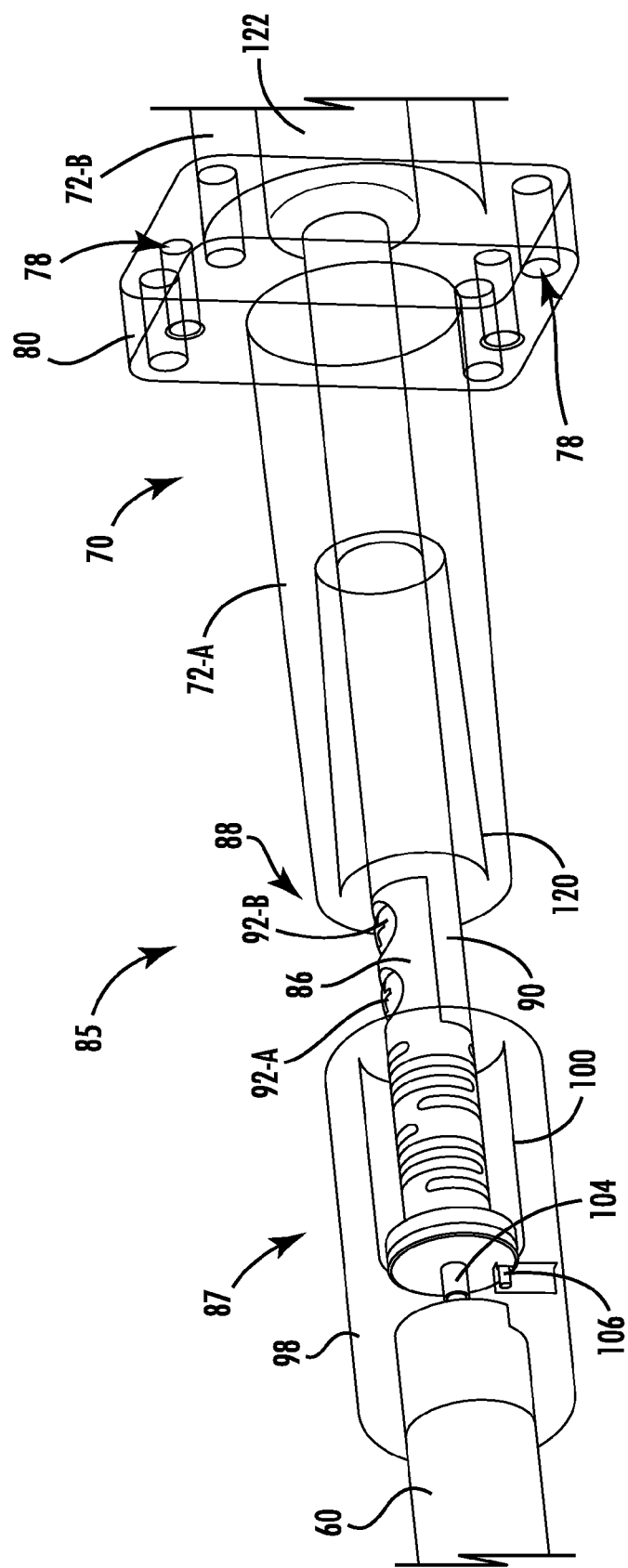
FIG. 3 is a semi-transparent isometric view illustrating a connector of the lens component shown in FIG. 2 in accordance with embodiments of the present disclosure.

Referring now to FIGS. 2-3, the EPM 40 will be described in greater detail. As shown, the EPM 40 further includes multiple feedthrough components 70 extending through openings 74 of the set of sidewalls 52A-B. The feedthrough components 70 include a first section 72-A disposed external to the interior area 54 defined by the sidewalls 52A-B, and a second section 72-B disposed within the interior area 54. The feedthrough components 70 may be coupled to the sidewalls 52A-B via a set of feedthrough fasteners 76 secured within a set of corresponding feedthrough openings 78 formed through a flange 80.

Referring now to FIGS. 2-6, a connector for securing each feedthrough component 70 to each electrostatic element 60 will be described in greater detail. In exemplary embodiments, a connector 85 extends between, and couples together, the feedthrough components 70 and the electrostatic elements 60. More specifically, the connector includes a flexible coupling 86 connected at a first end 87 to the electrostatic element 60 and at a second end 88 to a stub 90 protruding from the feedthrough component 70. In one non-limiting embodiment, the flexible coupling 86 and the stub 90 are made from stainless steel. In other embodiments, the flexible coupling 86 and the stub 90 are made from any number of different materials, depending on the application.

As shown, the flexible coupling 86 and the stub partially overlap, and are secured to one another by a plurality of fasteners 92A-B. Although non-limiting, the plurality of fasteners 92A-B may be a pair of screws formed through openings 93A-B of the flexible coupling 86 and openings 94A-B (FIG. 6) of the stub 90. The plurality of fasteners 92A-B and overlapping design of the electrostatic element 60 and the stub 90 simplify in-situ rod removal, for example as demonstrated by the disconnected state of the connector 85 shown in FIG. 6. Furthermore, the dual fasteners 92A-B are retained within the flexible coupling 86 to insure the fasteners 92A-B don't fall into the machine during service. In one embodiment, an external cam locking surface 95 of the flexible coupling 86 engages an internal cam locking surface 97 of the stub 90 to prevent twisting or rotation of the connector 85.

Figure 4:
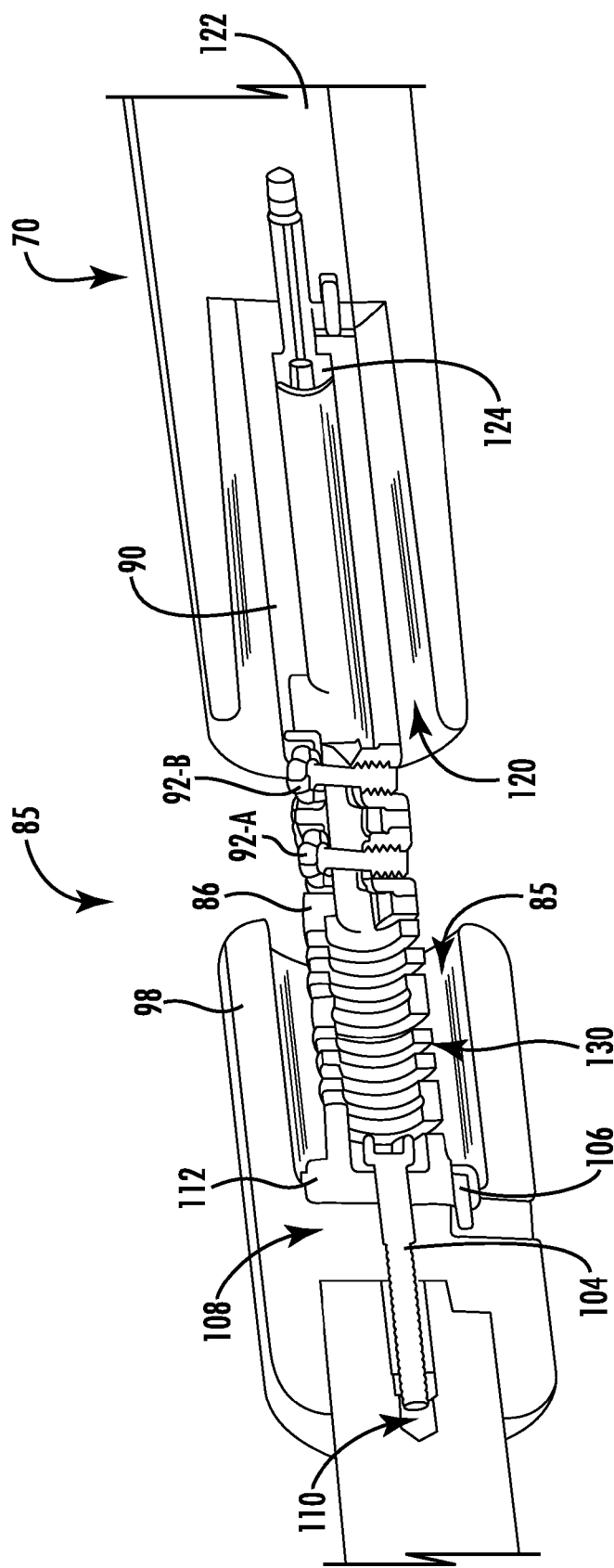
FIG. 4 is cutaway view illustrating the connector of the lens component shown in FIG. 3 in accordance with embodiments of the present disclosure.

Referring now to FIGS. 3-4, the connector 85 includes a shielding cup 98 partially surrounding the flexible coupling 86 and the conductive beam optic 60. As shown, the shielding cup 98 has a generally cylindrical shape and an internal bore 100 for securing the first end 87 of the flexible coupling 86 therein. More specifically, the connector 85 includes a first fastener 104 for securing the flexible coupling 86 to each of the plurality of electrostatic elements 60, and a second fastener 106 for securing the flexible coupling 86 to the shielding cup 98. In one embodiment, the first fastener 104 is a screw extending through a central portion 108 of the shield cup 98 and secures within a bore 110 of the electrostatic element 60. The first fastener 104 may be pinned for rotational control. Meanwhile, the second fastener 106 is secured to the shielding cup 98 through a flange 112 at the first end 87 of the flexible coupling. In some embodiments, the shielding cup 98 may include an opening 114 allowing access to second fastener 106.

As further shown, the stub 90 extends through a central bore 120 of the feedthrough component 70, connecting directly to a conductive element 122 of the feedthrough component 70 using one or more fasteners 124. In some embodiments, the fastener 124 is a screw.

Figure 5:
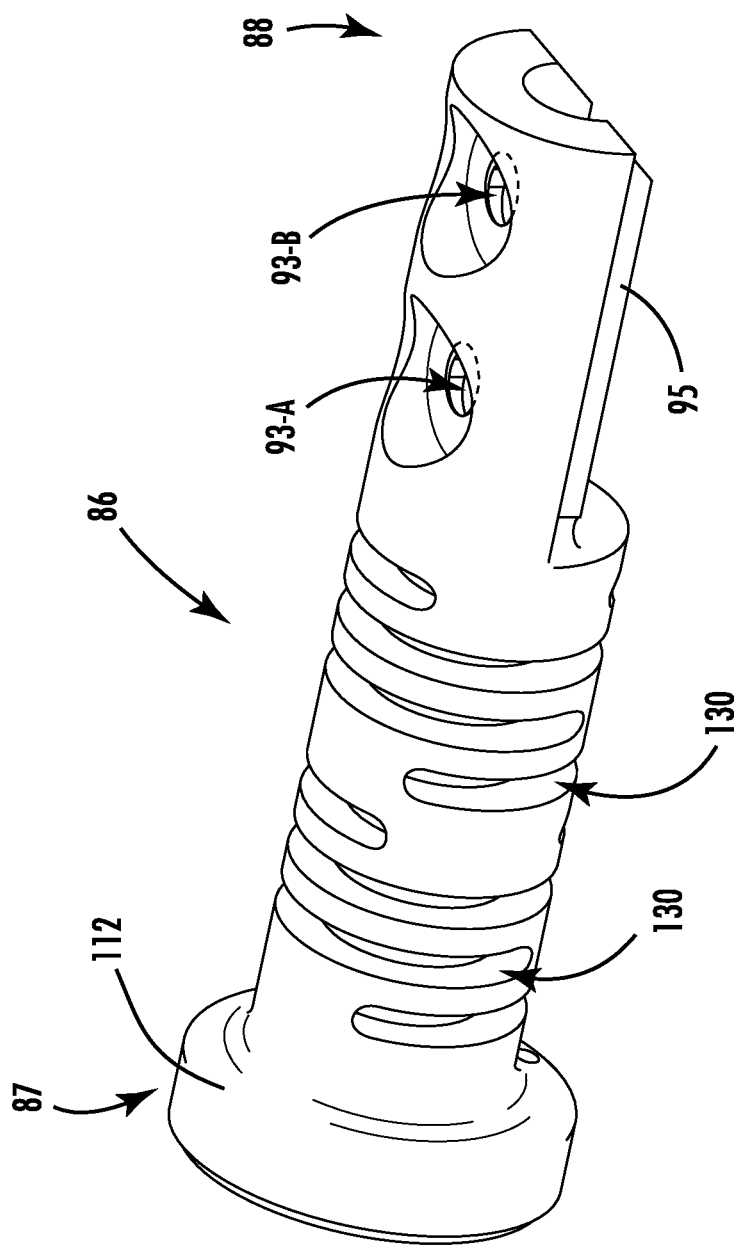
FIG. 5 is a perspective view of a flexible coupling of the connector shown in FIG. 3 in accordance with embodiments of the present disclosure.
Figure 6:
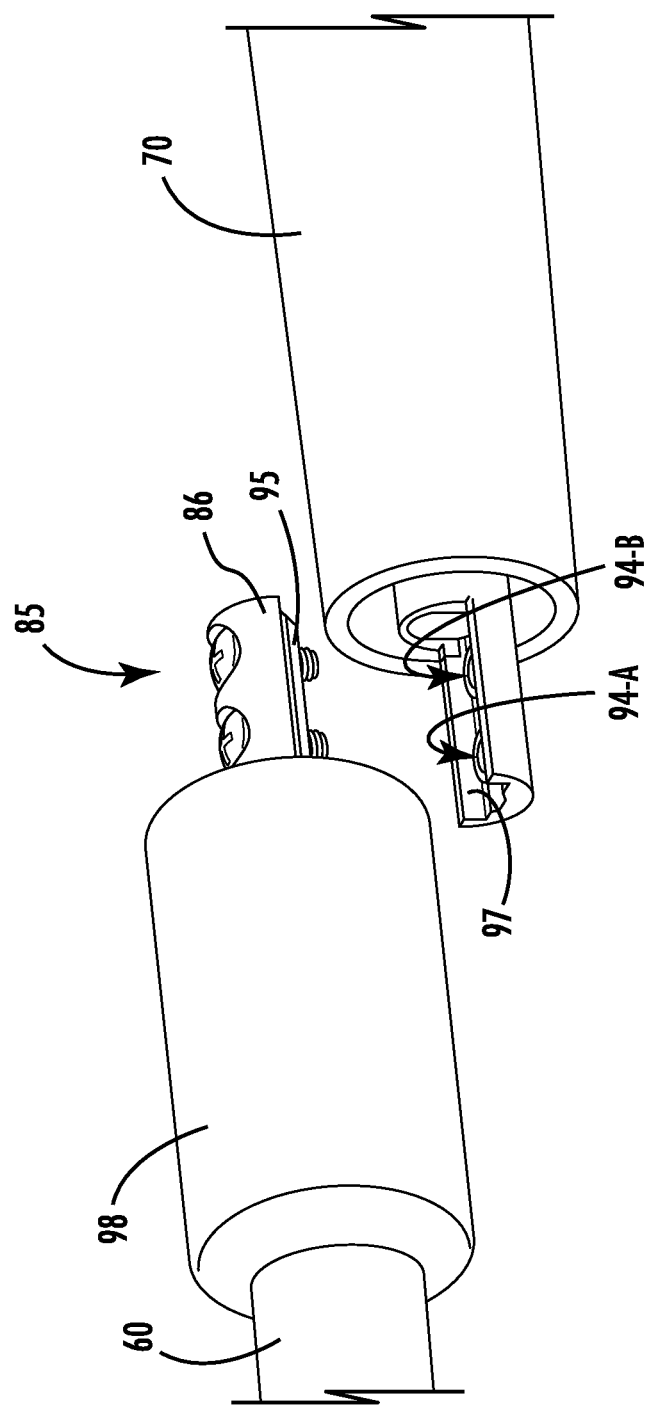
FIG. 6 is a perspective view illustrating the connector of the lens component shown in FIG. 3 in accordance with embodiments of the present disclosure.

Referring now to FIGS. 4-5, the flexible coupling 86 of the connector 85 will be described in greater detail. As shown, the flexible coupling 86 includes one or more slots 130 formed through the sidewalls thereof, for example, between the flange 112 and the openings 93A-B. In one embodiment, each slot 130 has a helical configuration extending around an outer circumference of the flexible coupling 86. The slots 130 may allow axial flex, twist, and expansion along the flexible coupling 86, thus allowing for tolerance compliance and thermal growth as the electrostatic element 60 increases in temperature. One will appreciate the slot 130 may vary in length, width, and configuration, as desired.

Figure 7:
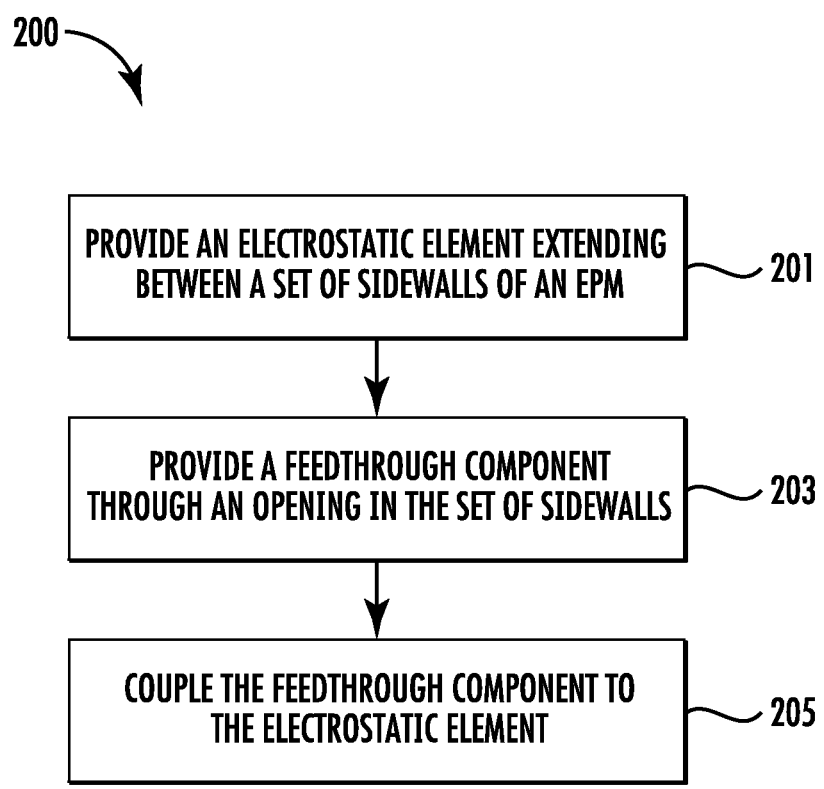
FIG. 7 is a flowchart illustrating an exemplary method in accordance with embodiments of the present disclosure.

Referring now to FIG. 7, a flow diagram illustrating an exemplary method 200 for securing electrostatic elements within an energy purity module in accordance with the present disclosure is shown. The method 200 will be described in conjunction with the representations shown in FIGS. 1-6.

The method 200 may include providing an electrostatic element extending between a set of sidewalls of an energy purity module (EPM), as shown at block 201. In some embodiments, the EPM may include a plurality of electrostatic elements. In some embodiments, the electrostatic element is a graphite rod.

The method 200 may further include providing a feedthrough component through an opening in the set of sidewalls, as shown at block 203. In some embodiments, the EPM further includes a plurality of feedthrough components extending through corresponding openings of the set of sidewalls. In some embodiments, the feedthrough component includes a stub extending therefrom.

The method 200 may further include coupling the feedthrough component to the electrostatic element using a connector, as shown at block 205. In some embodiments, the connector includes a flexible coupling secured at a first end to the electrostatic element and at a second end to a stub protruding from the feedthrough component. In some embodiments, the flexible coupling overlaps with the stub. In some embodiments, the flexible coupling is secured to the stub with a plurality of fasteners. In some embodiments, the plurality of fasteners are a pair of screws. In some embodiments, the flexible coupling is connected to the electrostatic element using a first fastener, and connected to a shielding cup using a second fastener.

In view of the foregoing, at least the following advantages are achieved by the embodiments disclosed herein. A first advantage of the disclosure includes improved serviceability using a two-piece overlapping connector design. A second advantage of the disclosure is the elimination of delicate features prone to breaking. A third advantage of the disclosure is increased clamping force on electrostatic elements to improve electrical contact. A fourth advantage of the disclosure is increased resiliency to mechanical and thermal tolerances due to the slots formed through the flexible coupling.

While certain embodiments of the disclosure have been described herein, the disclosure is not limited thereto, as the disclosure is as broad in scope as the art will allow and the specification may be read likewise. Therefore, the above description are not to be construed as limiting. Those skilled in the art will envision other modifications within the scope and spirit of the claims appended hereto.

The invention claimed is:

1. A lens component of an ion implantation system, the lens component comprising:
   a conductive beam optic extending between a set of sidewalls;
   a feedthrough component provided through openings in the set of sidewalls; and
   a connector securing the feedthrough component to the conductive beam optic, the connector including a flexible coupling connected at a first end to the conductive beam optic and at a second end to a stub protruding from the feedthrough component.

2. The lens component of claim 1, wherein the flexible coupling and the stub partially overlap.

3. The lens component of claim 1, wherein the flexible coupling and the stub are secured to one another by a plurality of fasteners.

4. The lens component of claim 1, further comprising a shielding cup partially surrounding the flexible coupling and the conductive beam optic.

5. The lens component of claim 4, further comprising a first fastener for securing the flexible coupling to the conductive beam optic and a second fastener for securing the flexible coupling to the shielding cup.

6. The lens component of claim 1, wherein the flexible coupling has a slot extending through a sidewall.

7. The lens component of claim 6, wherein the slot has a helical configuration extending around a circumference of the flexible coupling.

8. The lens component of claim 1, further comprising a plurality of conductive beam optics disposed along a beamline.

9. The lens component of claim 1, wherein the conductive beam optic is an electrostatic element.

10. A connector of an energy purity module (EPM), the connector comprising:
    a flexible coupling secured at a first end to an electrostatic element of a plurality of electrostatic elements, the plurality of electrostatic elements extending between a set of sidewalls of the EPM; and
    a stub protruding from a feedthrough component provided through the set of sidewalls, the stub secured to the flexible coupling at a second end of the flexible coupling.

11. The connector of claim 10, wherein the flexible coupling and the stub partially overlap.

12. The connector of claim 10, wherein the flexible coupling and the stub are secured together by a plurality of fasteners.

13. The connector of claim 10, further comprising a first fastener securing the flexible coupling to the electrostatic element of the plurality of electrostatic elements, and a second fastener securing the flexible coupling to a shielding cup partially surrounding the flexible coupling.

14. The connector of claim 10, wherein the flexible coupling has a slot extending through a sidewall.

15. The connector of claim 14, wherein the slot has a helical configuration extending around a circumference of the flexible coupling.

16. A method comprising:
    providing an electrostatic element extending between a set of sidewalls of an energy purity module (EPM);
    providing a feedthrough component through an opening in the set of sidewalls; and
    coupling the feedthrough component to the electrostatic element using a connector, the connector including a flexible coupling secured at a first end to the electrostatic element and at a second end to a stub protruding from the feedthrough component.

17. The method of claim 16, further comprising:
    overlapping the flexible coupling and the stub; and
    securing the flexible coupling and the stub together with a plurality of fasteners.

18. The method of claim 16, further comprising providing a shielding cup partially around the flexible coupling and the electrostatic element.

19. The method of claim 18, further comprising securing the flexible coupling to the electrostatic element using a first fastener, and securing the flexible coupling to the shielding cup using a second fastener.

20. The method of claim 16, further comprising providing a slot through a sidewall of the flexible coupling.

* * * * *